US009117785B2

(12) United States Patent
Kashiwabara et al.

(10) Patent No.: US 9,117,785 B2
(45) Date of Patent: Aug. 25, 2015

(54) DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Mitsuhiro Kashiwabara, Yokohama (JP); Toshiyuki Matsuura, Yokohama (JP)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 0 days.

(21) Appl. No.: 14/547,263

(22) Filed: Nov. 19, 2014

(65) Prior Publication Data

US 2015/0144914 A1    May 28, 2015

(30) Foreign Application Priority Data

Nov. 22, 2013 (JP) ................... 2013-241711
Nov. 22, 2013 (JP) ................... 2013-241781
Nov. 22, 2013 (JP) ................... 2013-242309
Jul. 2, 2014 (JP) ................... 2014-136504

(51) Int. Cl.
  *H01L 21/00* (2006.01)
  *H01L 27/32* (2006.01)
  *H01L 51/56* (2006.01)

(52) U.S. Cl.
  CPC ........ *H01L 27/3276* (2013.01); *H01L 27/3248* (2013.01); *H01L 51/56* (2013.01); *H01L 2227/323* (2013.01)

(58) Field of Classification Search
  None
  See application file for complete search history.

(56) References Cited

U.S. PATENT DOCUMENTS

| 6,812,493 | B2 * | 11/2004 | Nishio ............................ 257/69 |
| 7,608,857 | B2 | 10/2009 | Fujimori et al. |
| 2002/0011783 | A1 | 1/2002 | Hosokawa |
| 2003/0129790 | A1 * | 7/2003 | Yamazaki et al. ............ 438/149 |
| 2004/0232830 | A1 | 11/2004 | Hieda |
| 2005/0248266 | A1 | 11/2005 | Hosokawa |
| 2005/0258436 | A1 | 11/2005 | Arai |
| 2013/0187187 | A1 * | 7/2013 | Matsukura ..................... 257/99 |
| 2014/0252365 | A1 * | 9/2014 | Shinokawa et al. ............ 257/72 |
| 2014/0346484 | A1 * | 11/2014 | Nendai et al. .................. 257/40 |
| 2014/0353666 | A1 * | 12/2014 | Lee et al. ........................ 257/59 |
| 2015/0008458 | A1 * | 1/2015 | Yamazaki et al. ............. 257/89 |

FOREIGN PATENT DOCUMENTS

| EP | 1 191 820 A1 | 2/2001 |
| EP | 2 473 009 A1 | 8/2010 |
| EP | 2 608 251 A1 | 6/2013 |

(Continued)

*Primary Examiner* — Charles Garber
*Assistant Examiner* — Evren Seven
(74) *Attorney, Agent, or Firm* — Lee & Morse, P.C.

(57) ABSTRACT

Provided is a display device, including a pixel electrode in each of a plurality of pixels; an auxiliary wiring part including a first auxiliary wiring having a first edge portion, and a second auxiliary wiring having a second edge portion spaced apart from and facing the first edge portion; an insulating layer on the pixel electrode and the auxiliary wiring part, and in which a first opening and a second opening are defined, the first opening overlapping the pixel electrode, and the second opening overlapping the first edge portion and the second edge portion; an organic light-emitting layer on the insulating layer and contacting the pixel electrode through the first opening; and an upper electrode on the organic light-emitting layer and having a connection portion electrically connected with the auxiliary wiring part through the second opening.

8 Claims, 10 Drawing Sheets

(56) References Cited

FOREIGN PATENT DOCUMENTS

| | | |
|---|---|---|
| JP | 2001-195008 A | 7/2001 |
| JP | 2001-230086 A | 8/2001 |
| JP | 2001-345185 A | 12/2001 |
| JP | 2003-092192 A | 3/2003 |
| JP | 2004-207217 A | 7/2004 |
| JP | 2005-011810 A | 1/2005 |
| JP | 2005-093398 A | 4/2005 |
| JP | 2005-332773 A | 12/2005 |
| JP | 2012-044111 A | 3/2012 |
| JP | 2012-044110 A | 3/2013 |

* cited by examiner

DISPLAY DEVICE AND METHOD OF MANUFACTURING THE SAME

CROSS-REFERENCE TO RELATED APPLICATIONS

Japanese Patent Application Nos. JP2013-241781, filed on Nov. 22, 2013, JP2013-241711, filed on Nov. 22, 2013, JP2013-242309, filed on Nov. 22, 2013 and JP2014-136504, filed on Jul. 2, 2014, in the Japanese Patent Office, and entitled: "Display Device and Method of Manufacturing the Same," are incorporated by reference herein in their entireties.

BACKGROUND

1. Field

The present disclosure relates to a display device with an improved display quality.

2. Description of the Related Art

Display devices such as organic electroluminescence display devices have been developed, which use elements emitting light by a supplied current. In a top emission type display device among the organic electroluminescence display devices, a light-emitting direction of a light-emitting element may be defined as a direction away from a thin film transistor (TFT). An electrode disposed in a direction away from the light-emitting direction of the light-emitting element (hereinafter defined as an upper electrode) may be a metal thin film with light transmittance or may include a transparent conductive oxide.

SUMMARY

Embodiments may be realized by providing a display device, including a pixel electrode in each of a plurality of pixels; an auxiliary wiring part including a first auxiliary wiring having a first edge portion, and a second auxiliary wiring having a second edge portion spaced apart from and facing the first edge portion; an insulating layer on the pixel electrode and the auxiliary wiring part, and in which a first opening and a second opening are defined, the first opening overlapping the pixel electrode, and the second opening overlapping the first edge portion and the second edge portion; an organic light-emitting layer on the insulating layer and contacting the pixel electrode through the first opening; and an upper electrode on the organic light-emitting layer and having a connection portion electrically connected with the auxiliary wiring part through the second opening.

A separation distance between the first edge portion and the second edge portion may be smaller than a separation distance between the first auxiliary wiring or the second auxiliary wiring and the pixel electrode.

The separation distance between the first edge portion and the second edge portion may be in a range from about 5 μm to about 100 μm.

The upper electrode may have a plurality of connection portions and a contact resistance of each of the connection portions may be about 200 kΩ or less.

The display device may further include a power connecting electrode electrically connected with the upper electrode to apply a power for the organic light-emitting layer to emit light. The power connecting electrode may be electrically connected with the auxiliary wiring through the upper electrode.

The display device may further include a first auxiliary wiring terminal electrically connected with the first auxiliary wiring; and a second auxiliary wiring terminal electrically connected with the second auxiliary wiring. The first and second auxiliary wiring terminals may be located outside a display area.

The pixel electrode, the first auxiliary wiring, and the second auxiliary wiring may be on the same layer.

Embodiments may be realized by providing a method of manufacturing a display device, the method including forming a pixel electrode on a substrate; forming, on the substrate, a first auxiliary wiring and a second auxiliary wiring spaced apart from the first auxiliary wiring; forming an organic light-emitting layer on the pixel electrode, the first auxiliary wiring, and the second auxiliary wiring; inducing an electrical discharge between the first and second auxiliary wirings by applying a voltage to each of the first and second auxiliary wirings to remove a portion of the organic light-emitting layer located between the first and second auxiliary wirings and form an opening in the organic light-emitting layer; and forming an upper electrode electrically connected with the first and second auxiliary wirings, the upper electrode contacting the first and second auxiliary wirings through the opening.

The first auxiliary wiring, the second auxiliary wiring, and the pixel electrode may be formed on the same layer.

The first auxiliary wiring, the second auxiliary wiring, and the pixel electrode may be formed of the same material.

A voltage may be applied to a first auxiliary wiring terminal electrically connected to the first auxiliary wiring, and a voltage may be applied to a second auxiliary wiring terminal electrically connected to the second auxiliary wiring, thereby inducing an electric discharge.

A separation distance between edge portions of the first and second auxiliary wirings facing each other may be smaller than a separation distance between the first or second auxiliary wiring and the pixel electrode.

The separation distance between edge portions of the first and second auxiliary wiring facing each other may be in a range from about 5 μm to about 100 μm.

The method may further include, before inducing the electrical discharge between the first and second auxiliary wirings, forming a conductive layer covering a vicinity of edge portions of the first and second auxiliary wiring facing each other on the organic light-emitting layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
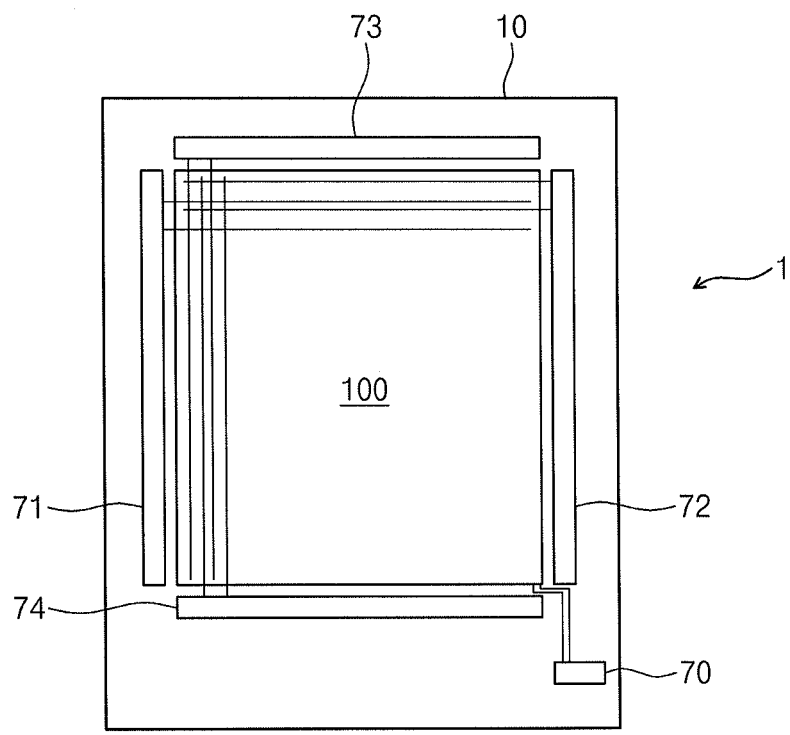
FIG. 1 illustrates a schematic view of a display device according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

First Embodiment

A display device according to a first embodiment will now be described in detail with reference to the accompanying drawings.

FIG. 1 illustrates a schematic view of a display device according to a first embodiment.

Referring to FIG. 1, the display device 1 may be a top emission type organic electroluminescence display device. The display device 1 may be used for electronic apparatuses displaying an image such as smartphones, mobile phones, personal computers and televisions. On a substrate 10, elements for driving the display device 1 may be disposed. A display area 100 may be defined in the substrate 10, and driving circuits 71, 72, 73, and 74 driving pixels (pix in FIG. 8B) disposed in the display area 100, and a voltage applying part 70 applying a voltage to the pixels may be disposed around the display area 100. A plurality of signal lines (not shown), which control the pixels and thin film transistors (not shown) electrically connected with the pixels may be disposed in the display area 100.

The driving circuits 71, 72, 73, and 74 may include a driver controlling the driving of each pixel in the display area 100 through the plurality of signal lines. Additionally, a power connecting electrode 250 in FIG. 4 may be disposed outside the display area 100, and power for supplying electrical power to allow an organic light-emitting layer (400 in FIG. 4) to emit light may be applied to an upper electrode (500 in FIG. 4) through the power connecting electrode 250.

Figure 2:
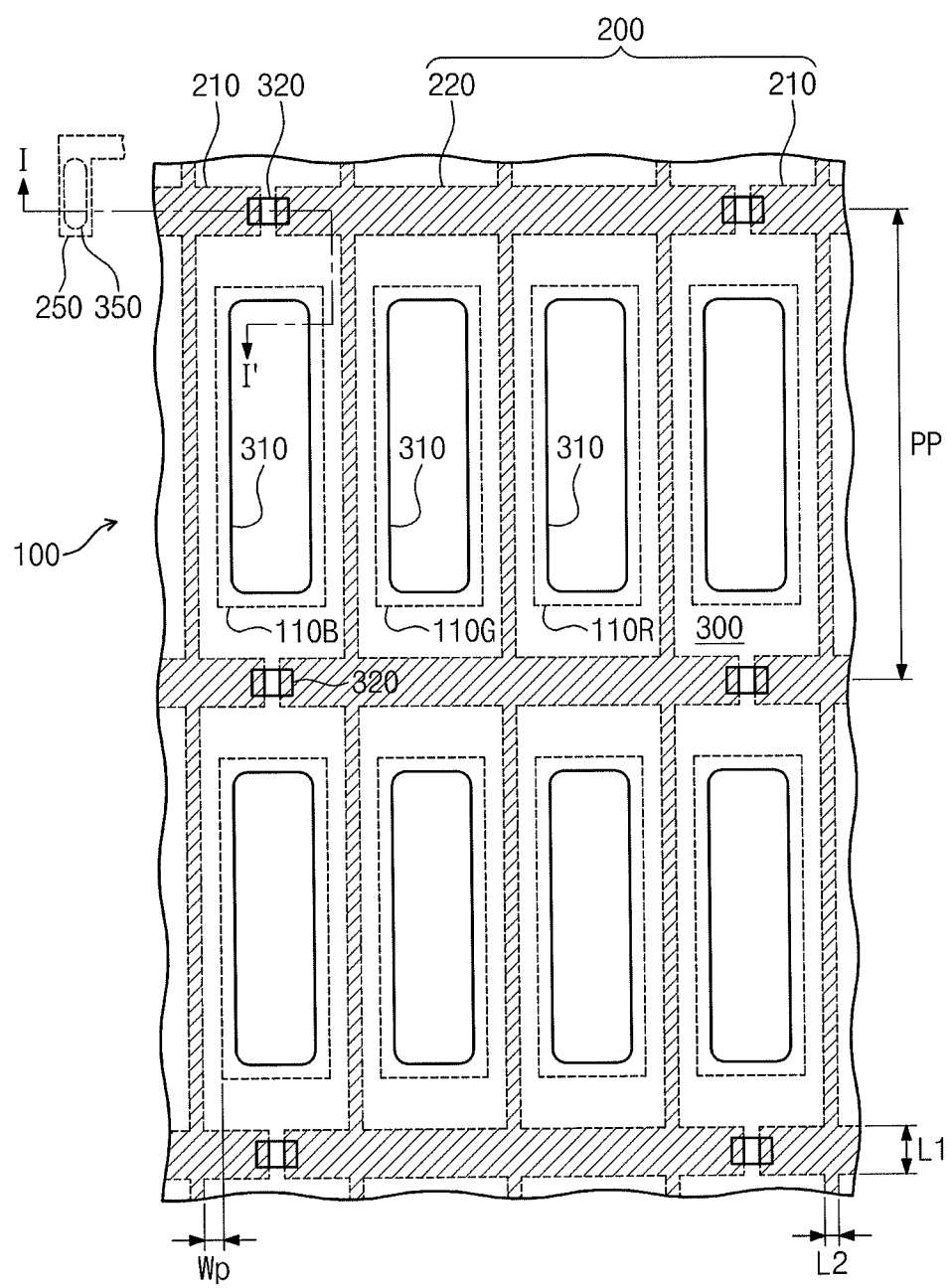
FIG. 2 illustrates a plan view of an auxiliary wiring part having the display device in FIG. 1.

FIG. 2 illustrates a plan view of an auxiliary wiring part 200 having the display device 1 in FIG. 1. In FIG. 2, a portion of the auxiliary wiring part 200 is shown in the display area 100.

Referring to FIG. 2, pixel electrodes 110B, 110G, and 110R may be disposed to blue pixels, green pixels and red pixels respectively based on one-to-one correspondence. Each of the pixel electrodes 110B, 110G, and 110R may be electrically connected with a pixel circuit through a TFT. In this embodiment, a pixel pitch PP may be, for example, about 636 μm.

The auxiliary wiring part 200 may include a first auxiliary wiring 210 and a second auxiliary wiring 220, and the first auxiliary wiring 210 may be spaced apart from the second auxiliary wiring 220. The auxiliary wiring part 200 may be disposed between two pixel electrodes adjacent to each other among the pixel electrodes 110B, 110G, and 110R. In this embodiment, a first line width L1 of the auxiliary wiring part 200 may be about 66 μm, and a second line width L2 of the auxiliary wiring part 200 may be about 22 μm.

The auxiliary wiring part 200 may be a conductive film, and in this embodiment, the conductive film may include a silver alloy layer and a transparent conductive layer stacked on the silver alloy layer. For example, the silver alloy layer may include AgPdCu and the transparent conductive layer may include indium tin oxide (ITO). As similar to the auxiliary wiring part 200, the pixel electrodes 110B, 110G, and 110R may include a silver alloy layer and a transparent conductive layer stacked on the silver alloy layer.

An insulating layer 300 may be disposed on the pixel electrodes 110B, 110G, and 110R and the auxiliary wiring part 200. The insulating layer 300 may include an organic resin such as polyimide. In the insulating layer 300, a first opening 310 and a second opening 320 may be defined. The first opening 310 may overlap each of the pixel electrodes 110B, 110G, and 110R, and each of the pixel electrodes 110B, 110G, and 110R may be connected to the organic light-emitting layer 400 through the first opening 310. The second opening 320 may overlap a portion of the auxiliary wiring part 200.

Figure 3:
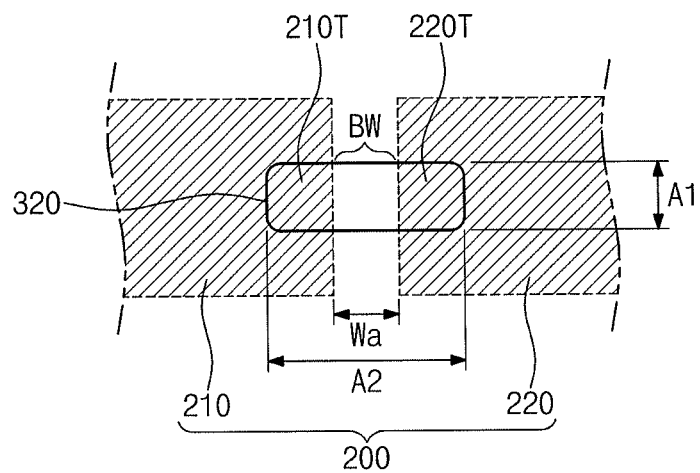
FIG. 3 illustrates an enlarged plan view of a vicinity of a second opening in FIG. 2.

FIG. 3 illustrates an enlarged plan view of a vicinity of the second opening 320 in FIG. 2.

Referring to FIG. 3, the auxiliary wiring part 200 may include the first auxiliary wiring 210 and the second auxiliary wiring 220, and the first auxiliary wiring 210 may include a first edge portion 210T and the second auxiliary wiring 220 may include a second edge portion 220T spaced apart from the first edge portion 210T. The first edge portion 210T may face the second edge portion 220T and the second opening 320 may overlap the first and second edge portions 210T and 220T. In this embodiment, the width A1 of the second opening 320 may be about 10 μm to about 20 μm, and the length A2 of the second opening 320 may be about 30 μm to about 40 μm, for example, the width A1 of the second opening 320 may be about 15 μm and the length A2 of the second opening 320 may be about 35 μm.

The gap between the first edge portion 210T and the second edge portion 220T may be defined as an edge gap BW, and a first separation distance Wa of the edge gap BW may be about 5 μm to 20 μm. In this embodiment, the first separation distance Wa may be shorter than a second separation distance (Wp in FIG. 2) between the auxiliary wiring part 200 and each of the pixels (110B, 110G, and 110R).

Referring to FIG. 2 again, the power connecting electrode 250 may be disposed outside the display area 100. A power to allow an organic light-emitting layer (400 in FIG. 4) to emit light may be applied to the power connecting electrode 250. A portion of the power connecting electrode 250 may be exposed through a third opening 350 defined in the insulating layer 300.

Figure 4:
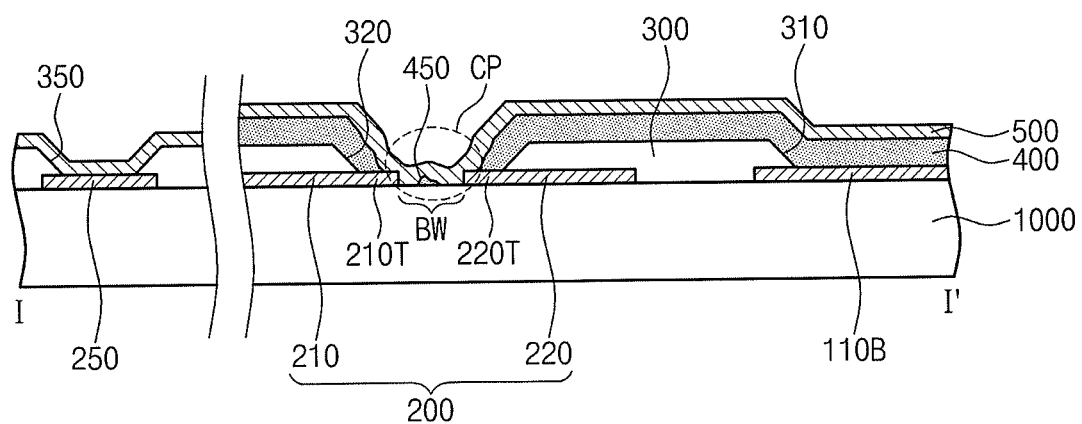
FIG. 4 illustrates a cross-sectional view taken along line I-I' in FIG. 2.

FIG. 4 illustrates a cross-sectional view taken along line I-I' in FIG. 2.

Referring to FIG. 4, the substrate 1000 may be a glass substrate and the driving circuits (71, 72, 73, and 74 in FIG. 1) and the voltage applying part (70 in FIG. 1) may be disposed on the substrate 1000. On the surface of the substrate 1000, an insulating film such as a polyimide film may be provided for planarization.

In this embodiment, the pixel electrode 110B, the first auxiliary wiring 210, the second auxiliary wiring 220, and the power connecting electrode 250 may be disposed on the same layer, and include the same conductive material. In the insulating layer 300, the first opening 310, the second opening 320 and the third opening 350 may be defined. A portion of the pixel electrode 110B may be exposed through the first opening 310, a portion of the auxiliary wiring part 200 may be exposed through the second opening 320, and a portion of the power connecting electrode 250 may be exposed through the third opening 350.

The organic light-emitting layer 400 may be disposed on the insulating layer 300. The organic light-emitting layer 400 has a partially removed shape corresponding to the edge gap BW. As illustrated in FIG. 4, a residue 450 of the organic light-emitting layer 400 may exist in the edge gap (BW), which will be described in more detail with reference to FIG. 7 and FIGS. 8A and 8B.

The upper electrode 500 may be disposed on the organic light-emitting layer 400. In addition, as described above in detail, a portion of the organic light-emitting layer 400 corresponding to the edge gap BW may be removed, the upper electrode 500 may be in contact with the first edge portion 210T of the first auxiliary wiring 210 and the second edge portion 220T of the second auxiliary wiring 220, and the upper electrode 500 may include a connection portion CP electrically connected to the auxiliary wiring part 200.

Additionally, in this embodiment, the upper electrode 500 may be disposed also on the power connecting electrode 250, and a power used for allowing the organic light-emitting layer 400 to emit light may be applied to the upper electrode 500 through the power connecting electrode 250. In this embodiment, the pixel electrode 110B may operate as an anode and the auxiliary wiring part 200 may be electrically connected with the power connecting electrode 250 through the upper electrode 500, and an electrical resistance of the upper electrode 500 may be reduced. Furthermore, the upper electrode 500 and the voltage applying part 70 may be electrically connected with each other through the upper electrode 500.

FIG. 5, FIG. 6, FIG. 7, FIG. 8A and FIG. 8B illustrate a manufacturing method of the display device in FIG. 4.

Figure 5:
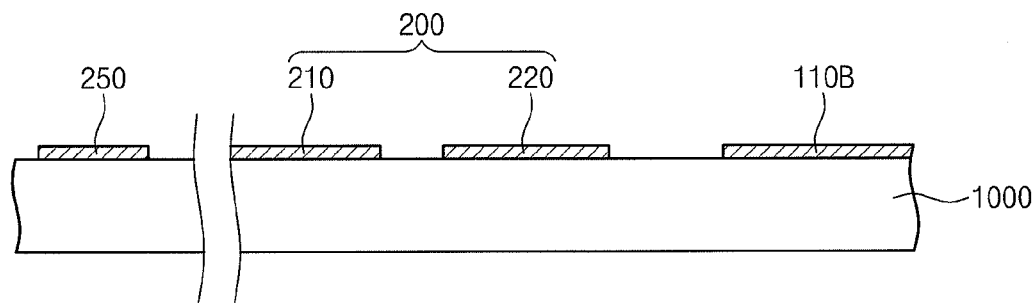
FIGS. 5 through 7, and FIGS. 8A and 8B illustrate a manufacturing method of the display device in FIG. 4.

Referring to FIG. 5, a conductive film may be formed on the substrate 1000 and then the conductive film may be patterned to form the pixel electrode 110B, the first auxiliary wiring 210, the second auxiliary wiring 220, and the power connecting electrode 250. In this embodiment, the conductive film may be patterned by photolithography.

Figure 6:
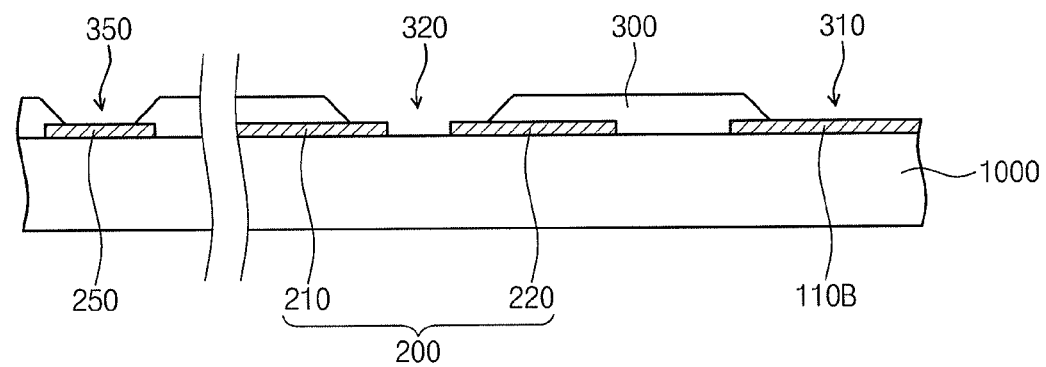

Referring to FIG. 6, the insulating layer 300 including the first opening 310, the second opening 320 and the third opening 350 may be formed on the substrate 1000. A source film including a photosensitive polyimide may be formed on the substrate 1000, and thereafter, the insulating layer 300 in which the first, second and third openings 310, 320, and 350 are defined may be formed by performing, on the source film, a patterning process using photolithography.

Figure 7:
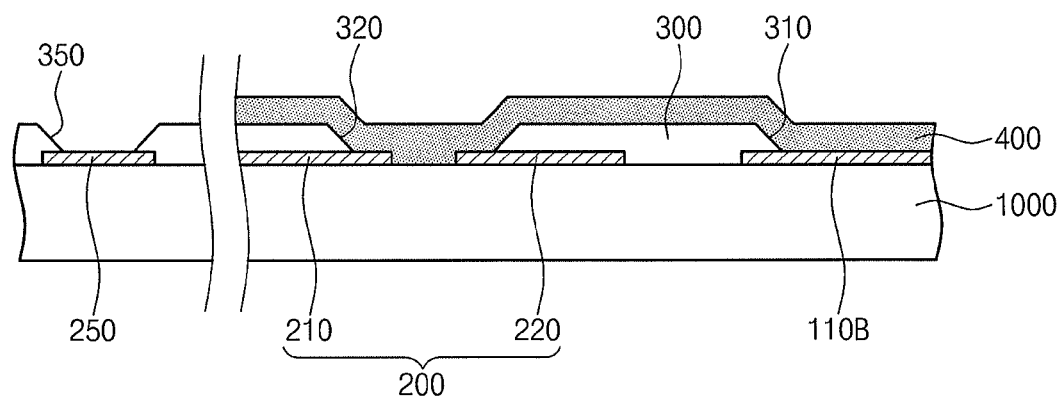

Referring to FIG. 7, the organic light-emitting layer 400 may be formed on the substrate 1000. Before the organic light-emitting layer 400 is formed, oxygen plasma treatment may be performed. The organic light-emitting layer 400 may have a uniform thickness as illustrated in FIG. 7. In embodiments, the organic light-emitting layer 400 may have a different thickness or a different stacking structure according to the region.

Figure 8A:
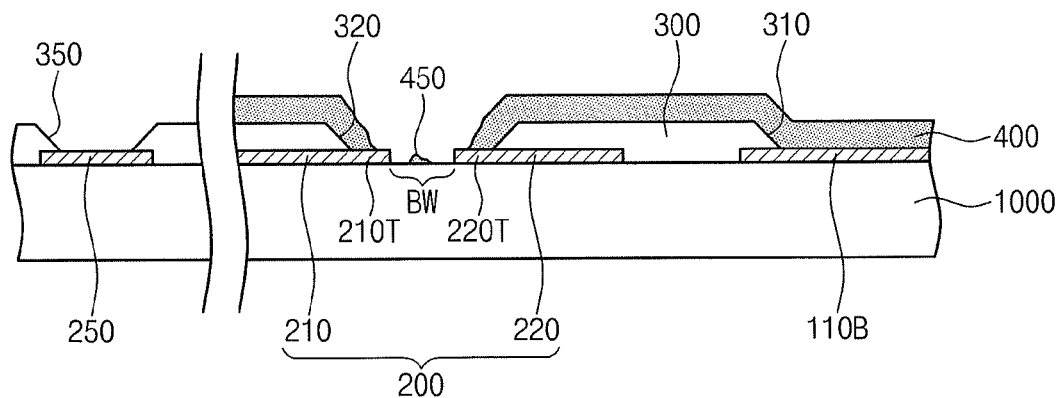
Figure 8B:
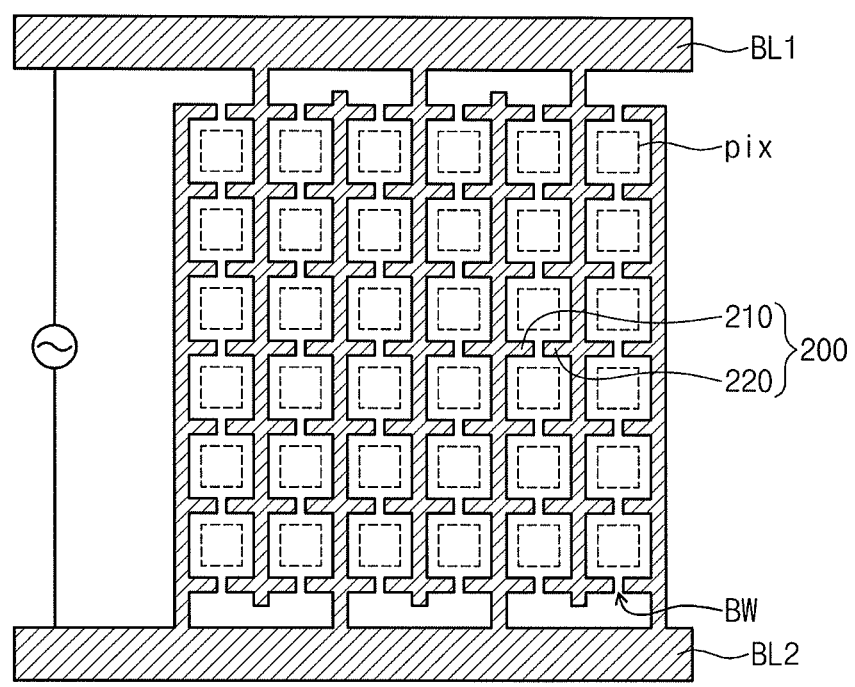

Referring to FIG. 8A and FIG. 8B, an electric discharge may be induced between the first and second auxiliary wirings 210 and 220 by applying a voltage to each of the first auxiliary wiring 210 and the second auxiliary wiring 220. For example, the voltage may have a frequency about 100 KHz and a root-mean-square voltage in a range from about 100 Vrm to about 300 Vrms, and an electric discharge may be induced between the first and second auxiliary wirings 210 and 220.

In this embodiment, the voltage may be applied to the first auxiliary wiring 210 through a first auxiliary wiring terminal BL1, and to the second auxiliary wiring 220 through a second auxiliary wiring terminal BL2. The first auxiliary wiring terminal BL1 may be disposed outside the display area 100 including a plurality of pixels (pix) to be electrically connected with the first auxiliary wiring 210, and the second auxiliary wiring terminal BL2 may be disposed outside the display area 100 to be electrically connected with the first auxiliary wiring 220.

In this embodiment, the plurality of the edge gaps BW may be located corresponding to two sides of the pixels (pix) facing each other.

An electric discharge may be induced between the first and second auxiliary wirings 210 and 220, as illustrated in FIG. 8A, and a portion of the organic light-emitting layer 400 may be removed due to energy caused by the electric discharge. Each of the first edge portion 210T of the first auxiliary wiring 210 and the second edge portion 220T of the second auxiliary wiring 220 may be partially exposed, and the residue 450 of the organic light-emitting layer 400 may remain between the first and second auxiliary wirings 210 and 220.

Description was exemplarily given of the case in which each of the first and second auxiliary wirings 210 and 220 is provided singly. In embodiments, the first and second auxiliary wirings 210 and 220 may be provided in plurality, a voltage may be applied across the entire auxiliary wiring part 200, and the electric discharge may be induced in plurality between the plurality of first auxiliary wirings 210 and the plurality of second auxiliary wirings 220, and the organic light-emitting layer 400 may be partially removed in correspondence with the positions of electric discharges induced in plurality.

In this embodiment, the separation distance of the edge gap BW may be in the range of about 5 μm to about 100 μm, the organic light-emitting layer 400 may be partially removed by the electric discharge, and the edge portions 210T and 220T may be easily exposed. When the separation distance of the edge gap BW is less than 5 μm, a short may happen between the first and second edge portions 210T and 220T. Additionally, when the separation distance of the edge gap BW is more than 5 μm, conditions for inducing the electric discharge to remove the organic light-emitting layer 400 may be strictly restricted, a level of a voltage applied to the first and second edge portions 210T and 220T increases, and elements such as TFTs disposed on the substrate 1000 may be damaged by the voltage.

Furthermore, as the electrical resistance of the connection between the auxiliary wiring part 200 and the upper electrode 500 becomes smaller, the effect of reducing the electrical resistance of the upper electrode 500 by the auxiliary wiring part 200 may become larger. The brightness of the display device may become uniform, and power consumption of the display device may be reduced. In this embodiment, the electrical resistance of the connection between the auxiliary wiring part 200 and the upper electrode 500 may be about 200 kΩ or less, and the voltage drop at the connection between the auxiliary wiring part 200 and the upper electrode 500 may be controlled to 2 V or less. In embodiments, the electrical resistance of the connection between the auxiliary wiring part 200 and the upper electrode 500 may be about 50 kΩ or less, and the voltage drop at the connection between the auxiliary wiring part 200 and the upper electrode 500 may be controlled to 0.5 V or less.

Moreover, a single connection between the auxiliary wiring part 200 and the upper electrode 500 may be formed for one pixel, or a single connection between the auxiliary wiring part 200 and the upper electrode 500 may be formed for n number of pixels (where n is a natural number equal to or more than 2).

As in the first embodiment described above, the organic light-emitting layer 400 located between the first auxiliary wiring 210 and the second auxiliary wiring 220 adjacent to each other may be partially removed easily by the electric discharge, and there may be no need to remove the organic light-emitting layer 400 by using other means such as a laser. A mask alignment which defines a laser irradiation position may be unnecessary, and a process for selectively removing the organic light-emitting layer 400 may be simplified.

After removing the organic light-emitting layer 400 partially and forming the upper electrode 500 on the light-emitting layer 400, the first and second auxiliary wirings 210 and 220 may be connected to the upper electrode 500 as illustrated in FIG. 4. In this embodiment, the upper electrode 500 may operate as a cathode.

After forming the upper electrode 500, an encapsulation process may be performed on a substrate 1000 on which the organic light-emitting layer 400, the upper electrode 500 and the pixel electrode 110B may be formed, by using an encapsulant such as a transparent encapsulating glass.

Second Embodiment

In the first embodiment described above in detail, a voltage may be simultaneously applied to the entire auxiliary wiring part 200, and the electric discharge may be induced simultaneously not only at the edge gap BW between the first edge portion 210T and the second edge portion 220T illustrated in FIG. 4 but also at the edge gaps BW between the first auxiliary wirings 210 and the second auxiliary wirings 220 which are defined in the entire display area (100 in FIG. 2). The second embodiment differs from the first embodiment in that the auxiliary wiring part 200 is divided according to a region and the electric discharge occurs sequentially at the divided auxiliary wiring parts 200, which will be more fully described with reference to FIG. 9 hereinafter.

Figure 9:
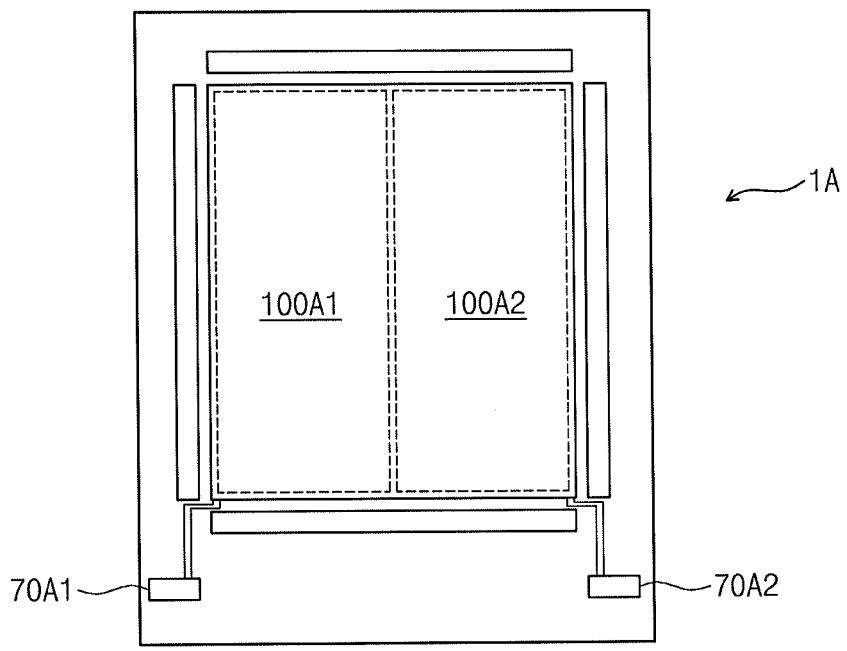
FIG. 9 illustrates a schematic view of a construction of a display device according to a second embodiment.

FIG. 9 illustrates a schematic view of a construction of a display device according to the second embodiment.

Referring to FIGS. 4 and 9, a display area of a display device 1A may be divided into a first display area 100A1 and a second display area 100A2. The display device 1A may include a first voltage applying part 70A1 and a second voltage applying part 70A2. A portion of an auxiliary wiring part 200 located in the first display area 100A1 receives a voltage through the first voltage applying part 70A1, and the other portion of the auxiliary wiring part 200 located in the second display area 100A2 receives a voltage through the second voltage applying part 70A2.

In the second embodiment, a voltage may need not be applied at once to the entire auxiliary wiring part 200 disposed across the first and second display areas 100A1 and 100A2, and it may be possible to prevent damage to elements such as TFTs disposed on the display device 1A caused by an increase of a current.

Third and Fourth Embodiments

Referring to FIG. 3 again, in the first embodiment, each of the first edge portion 210T of the first auxiliary wiring 210 and the second edge portion 220T of the second auxiliary wiring 220 has a rectangular shape on a plane. The fourth embodiment differs from the first embodiment in that each edge portion of the first auxiliary wiring 210 and the second auxiliary wiring 220 may have a different shape, which will be more fully described with reference to FIGS. 10 and 11 hereinafter.

Figure 10:
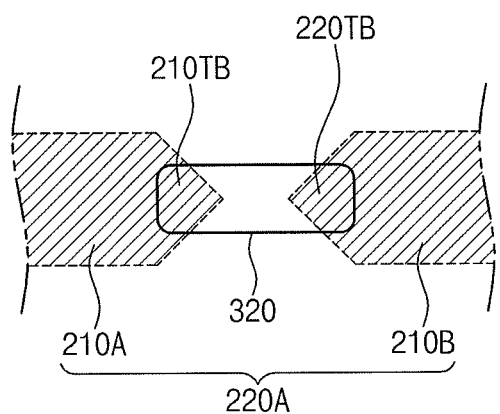
FIG. 10 illustrates an enlarged plan view of auxiliary wirings according to a third embodiment.

FIG. 10 illustrates an enlarged plan view of auxiliary wirings according to a third embodiment.

Referring to FIG. 10, the auxiliary wiring part 220A may include a first auxiliary wiring 210A and a second auxiliary wiring 210B. The first auxiliary wiring 210A may include a first edge portion 210TB, and the second auxiliary wiring 210B may include a second edge portion 220TB. The first edge portion 210TB may face the second edge portion 220TB and the first and second edge portions 210TB and 220TB may be spaced apart from each other.

In the third embodiment, each of the first and second edge portions 210TB and 220TB has a triangular shape on a plane, the shortest distance between the first and second edge portions 210TB and 220TB may be defined as a distance between the vertex of the triangle defined in the first edge portion 210TB and the vertex of the triangle defined in the second edge portion 220TB, and an electric discharge between the first and second edge portions 210TB and 220TB may occur more easily.

Figure 11:
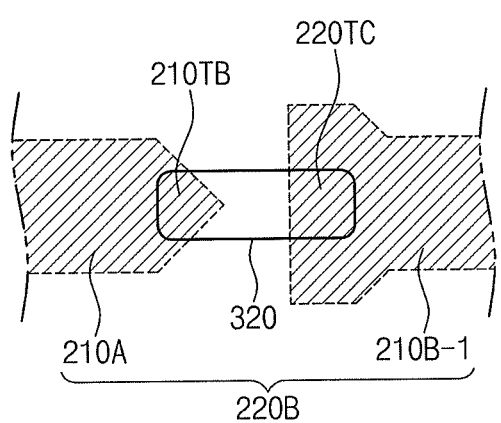
FIG. 11 illustrates an enlarged plan view of an auxiliary wirings according to a fourth embodiment.

FIG. 11 illustrates an enlarged plan view of auxiliary wirings according to a fourth embodiment.

Referring to FIG. 11, the auxiliary wiring part 220B may include a first auxiliary wiring 210A and a second auxiliary wiring 210B-1. The first auxiliary wiring 210A may include a first edge portion 210TB, and the second auxiliary wiring 210B-1 may include a second edge portion 220TC. The first edge portion 210TB may face the second edge portion 220TC, and the first and second edge portions 210TB and 220TC may be spaced apart from each other.

In the fourth embodiment, the second edge portion 210TC may have a rectangular shape on a plane, and the width of the second edge portion 210TC may be larger than the width of the second auxiliary wiring 210B-1. In embodiments, the first edge portion 210TB may have a rectangular shape on a plane, and the second edge portion 210TC may have a triangular shape on a plane. In still embodiments, each of the first edge portion 210TB and the second edge portion 210TC may have a rectangular shape on a plane.

Figure 12:
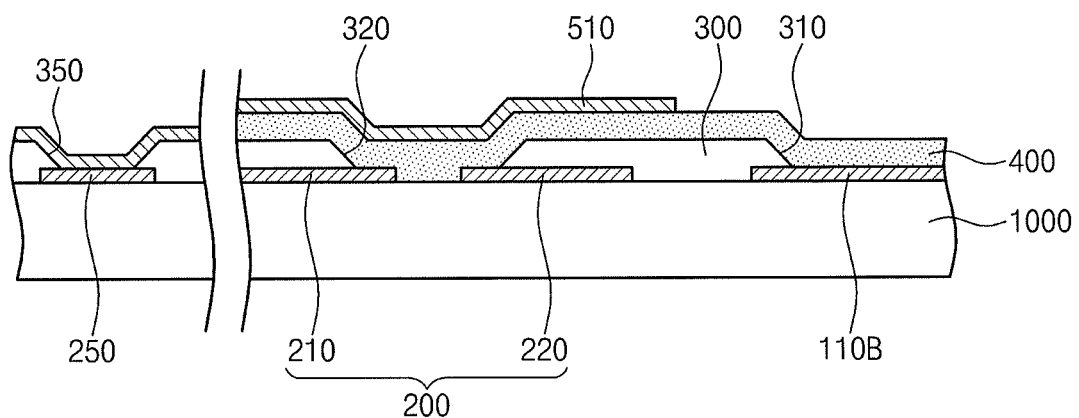
FIGS. 12 through 14 illustrate drawings of a manufacturing method of a display device according to a fourth embodiment.
Figure 13:
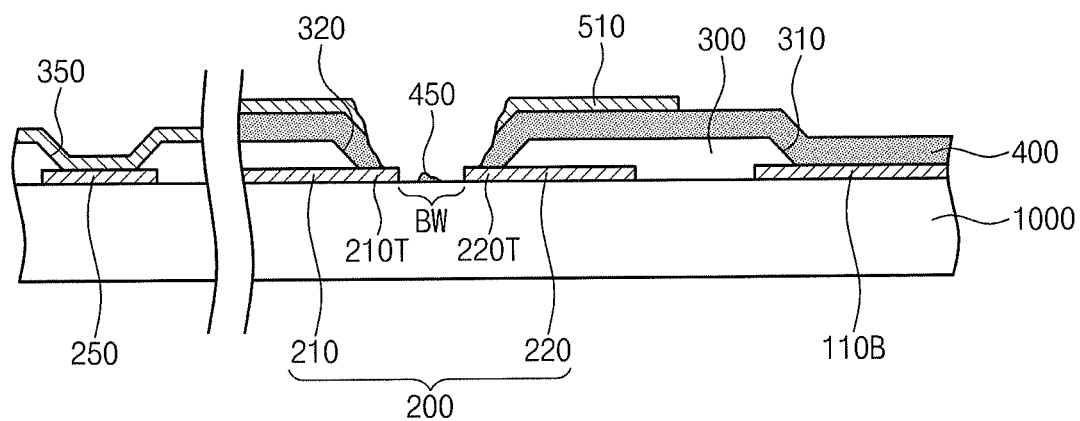
Figure 14:
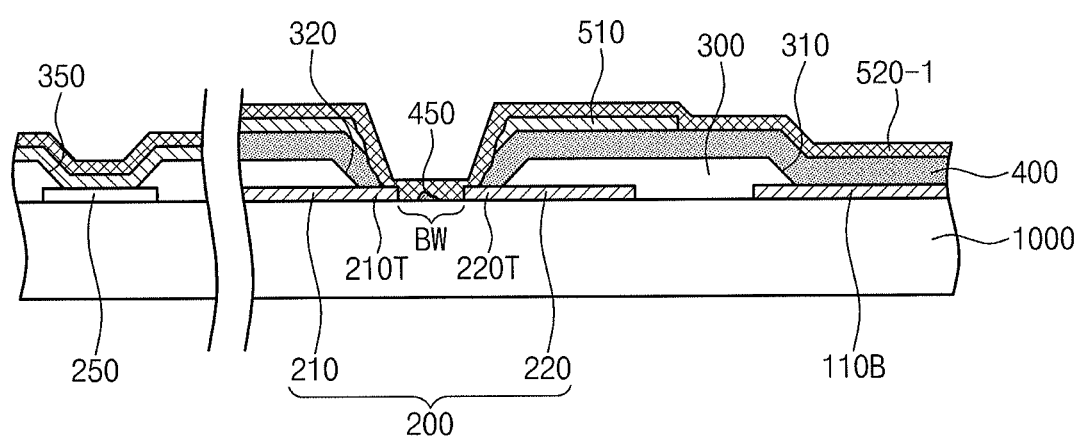

FIG. 12, FIG. 13 and FIG. 14 illustrate a manufacturing method of a display device according to the fourth embodiment. In the description of FIGS. 12 through 14, reference symbols are written together with like reference numerals for like elements described above and repeated descriptions thereof are omitted.

Referring to FIG. 12, an organic light-emitting layer 400 may be formed on a substrate 1000, and then a conductive layer 510 covering a portion of the organic light-emitting layer 400 located between a first auxiliary wiring 210 and a second auxiliary wiring 220 may be formed. In this embodiment, the conductive layer 510 may include aluminum and magnesium, and the conductive layer 510 may not cover a portion of the organic light-emitting layer 400 received in a first opening 310.

Referring to FIG. 13, as described above with reference to FIG. 8A and FIG. 8B, a voltage may be applied to each of the first auxiliary wiring 210 and the second auxiliary wiring 220. An electric discharge may be induced between the first edge portion 210T of the first auxiliary wiring 210 and the second edge portion 220T of the second auxiliary wiring 210, each of the organic light-emitting layer 400 and the conductive layer 510 corresponding to the edge gap BW may be partially removed by the electric discharge, and the first edge portion 210T and the second edge portion 220T may be exposed to the outside.

Referring to FIG. 14, an upper electrode 520-1 may be formed after exposing the first edge portion 210T and the second edge portion 220T. The first auxiliary wiring 210 and the second auxiliary wiring 220 may be electrically connected with each other by the upper electrode 520-1, and the upper electrode 520-1 may operate as a cathode since the upper electrode 520-1 may be disposed over a pixel electrode 100B with the organic light-emitting layer 400 disposed therebetween.

The conductive layer 510 may cover a vicinity of the edge gap BW before the electric discharge is induced between the first auxiliary wiring 210 and the second auxiliary wiring 210, and damage to the vicinity may be prevented, as described in this embodiment.

According to the method of manufacturing the display device, the display device further comprises the conductive layer 510 an element. The conductive layer 510 is disposed between the organic light-emitting layer 400 and the upper electrode 520-1 to electrically connected to the upper electrode 520-1. Additionally, the conductive layer 510 is placed around the first edge portion 210T of the first auxiliary wiring 210 and the second edge portion 220T of the second auxiliary wiring 220 to partially cover the organic light-emitting layer 400.

According to embodiments, the process of connecting the auxiliary wirings and the upper electrode may be simplified.

By way of summation and review, it may not be easy to reduce a resistance of an upper electrode of a metal thin film with light transmittance or including a transparent conductive oxide. A voltage drop due to the resistance of the upper electrode may cause non-uniformity of brightness of an image displayed on the organic electroluminescence display device and a brightness distribution. The brightness distribution may occur noticeably as the organic electroluminescence display device has a higher brightness and a larger screen needing a high current. Attempts have been made to reduce the voltage drop by connecting the upper electrode with an auxiliary wiring.

In the formation of organic light-emitting layers, as the number of layers which may be formed in common increases, a manufacturing process may become easier. It may be necessary to add a process of removing an organic layer formed on an auxiliary wiring, or to prevent the organic layer from adhering to the auxiliary wiring when forming the organic layer. A process for the auxiliary wiring may become complex, which may be a cause of a low production yield in a mass-production.

For example, it may be necessary to align and dispose a shield mask for irradiating only a required portion of a large screen display with a laser, or to align a mask in a vacuum and simultaneously perform laser irradiation multiple times.

Embodiments may simplify a process of connecting the auxiliary wiring and an upper electrode.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a pixel electrode in each of a plurality of pixels;
an auxiliary wiring part including a first auxiliary wiring having a first edge portion, and a second auxiliary wiring having a second edge portion spaced apart from and facing the first edge portion;
an insulating layer on the pixel electrode and the auxiliary wiring part, and in which a first opening and a second opening are defined, the first opening overlapping the pixel electrode, and the second opening overlapping the first edge portion and the second edge portion;
an organic light-emitting layer on the insulating layer and contacting the pixel electrode through the first opening; and
an upper electrode on the organic light-emitting layer and having a connection portion electrically connected with the auxiliary wiring part through the second opening.

2. The display device as claimed in claim 1, wherein a separation distance between the first edge portion and the second edge portion is smaller than a separation distance between the first auxiliary wiring or the second auxiliary wiring and the pixel electrode.

3. The display device as claimed in claim 2, wherein the separation distance between the first edge portion and the second edge portion is in a range from about 5 µm to about 100 µm.

4. The display device as claimed in claim 1, wherein the upper electrode has a plurality of connection portions and a contact resistance of each of the connection portions is about 200 kΩ or less.

5. The display device as claimed in claim 1, further comprising a power connecting electrode electrically connected with the upper electrode to apply a power for the organic light-emitting layer to emit light,
wherein the power connecting electrode is electrically connected with the auxiliary wiring through the upper electrode.

6. The display device as claimed in claim 1, further comprising:
a first auxiliary wiring terminal electrically connected with the first auxiliary wiring; and
a second auxiliary wiring terminal electrically connected with the second auxiliary wiring, wherein the first and second auxiliary wiring terminals are located outside a display area.

7. The display device as claimed in claim 1, wherein the pixel electrode, the first auxiliary wiring, and the second auxiliary wiring are on the same layer.

8. The display device as claimed in claim 1, further comprising a conductive layer,
wherein the conductive layer is disposed between the organic light-emitting layer and the upper electrode to electrically connected to the upper electrode, and the conductive layer is placed around the first edge portion of the first auxiliary wiring and the second edge portion of the second auxiliary wiring to partially cover the organic light-emitting layer.

* * * * *